(12) United States Patent
Hishiro et al.

(10) Patent No.: US 8,309,297 B2
(45) Date of Patent: Nov. 13, 2012

(54) METHODS OF LITHOGRAPHICALLY PATTERNING A SUBSTRATE

(75) Inventors: Yoshiki Hishiro, Boise, ID (US); Scott Sills, Boise, ID (US); Hiroyuki Mori, Boise, ID (US); Troy Gugel, Boise, ID (US); Paul D. Shirley, Meridian, ID (US); Lijing Gou, Boise, ID (US); Adam Olson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 972 days.

(21) Appl. No.: 11/868,328

(22) Filed: Oct. 5, 2007

(65) Prior Publication Data

US 2009/0092933 A1      Apr. 9, 2009

(51) Int. Cl.
*G03F 7/22*      (2006.01)

(52) U.S. Cl. ........ 430/322; 430/394; 430/326; 430/325; 430/396

(58) Field of Classification Search ........................ None
See application file for complete search history.

(56) References Cited

U.S. PATENT DOCUMENTS

| | | | |
|---|---|---|---|
| 3,697,178 A * | 10/1972 | Douglas | ............................ 355/77 |
| 5,851,927 A | 12/1998 | Cox et al. | |
| 5,985,497 A | 11/1999 | Phan et al. | |
| 6,222,936 B1 | 4/2001 | Phan et al. | |
| 6,358,676 B1 | 3/2002 | Wu | |
| 6,872,014 B1 | 3/2005 | Paxton et al. | |
| 7,198,964 B1 | 4/2007 | Cherry et al. | |
| 2005/0123838 A1 | 6/2005 | Chang et al. | |
| 2007/0082432 A1* | 4/2007 | Lee | ............................... 438/149 |

FOREIGN PATENT DOCUMENTS

WO    WO 2006/063268    6/2006

OTHER PUBLICATIONS

Kanna et al., *Materials and process Parameters on ArF Immersion Devectivity Study*, Proc. of SPIE, vol. 6153, pp. 615308-1 through 615308-10 (2006).
Malik et al., *Immersion Lithography Process and Control Challenges*, Yield Management Solutions, Cover Story, pp. 7-17 (KLA-Tencor Corporation, Spring 2007).
Miya et al., *Effective Rinse Aiming at Water-Mark-free Drying for Single-spin Wet Cleaning Process*, Solid State Phenomena, vols. 103-104, pp. 79-82 (Apr. 2005).
Nakagawa et al., *Improvement of Watermark Defect in Immersion Lithography: Mechanism of Watermark Defect Formation and its . . .*, Proc. of SPIE, vol. 6153, pp. 61531R-1 through 61531R-8 (2006).
Niiyama et al., *Solid Defects Condensation During Watermark Formation for Immersion Lithography*, Proc. of SPIE, vol. 6153, pp. 61531U-1 through 61531U-11 (2006).
Park et al.,*Effects of Drying Methods and Wettability of Silicon on the Formation of Water Marks in Semi-conductor Processing*, J. Electrochem. Soc., vol. 142, No. 6, pp. 2028-2031 (Jun. 1995).
Park et al., *The Formation of Water Marks on Both Hydrophilic and Hydrophobic Wafers*, Mat. Res. Soc. Symp. Proc., vol. 477, pp. 513-518 (1997).
*Weeding out Immersion-Type Defects*, Laura Peters, Lead Technical Editor, Semiconductor International, 2 pages (May 1, 2007), http://www.reed-electronics.com/semicondcutor/article/CA6434706.
Wallraff et al., *The Effect of Photoresist/Topcoat Properties on Defect Formation in Immersion Lithography*, Proc. of SPIE, vol. 6153, pp. 61531M-1 through 61531M-10 (2006).
Watanabe et al., *The Role of Atmospheric Oxygen and Water in the Generation of Water Marks on the Silicon Surface in Cleaning Processes*, Materials Science and Engineering, vol. B4, pp. 401-405 (1989).
Wei et al., *193nm Immersion-Related Defects and Strategies of Defect Reduction*, Future Fab Intl., vol. 22, 16 pages (Jan. 9, 2007).

* cited by examiner

*Primary Examiner* — Daborah Chacko Davis
(74) *Attorney, Agent, or Firm* — Wells St. John, P.S.

(57) ABSTRACT

A method of lithographically patterning a substrate that has photoresist having removal areas and non-removal areas includes first exposing at least the non-removal areas to radiation effective to increase outer surface roughness of the photoresist in the non-removal areas at least post-develop but ineffective to change photoresist solubility in a developer for the photoresist to be cleared from the non-removal areas upon develop with the developer. Second exposing of radiation to the removal areas is conducted to be effective to change photoresist solubility in the developer for the photoresist to be cleared from the removal areas upon develop with the developer. The photoresist is developed with the developer effective to clear photoresist from the removal areas and to leave photoresist in the non-removal areas that has outer surface roughness in the non-removal areas which is greater than that before the first exposing. Other implementations and embodiments are contemplated.

23 Claims, 5 Drawing Sheets

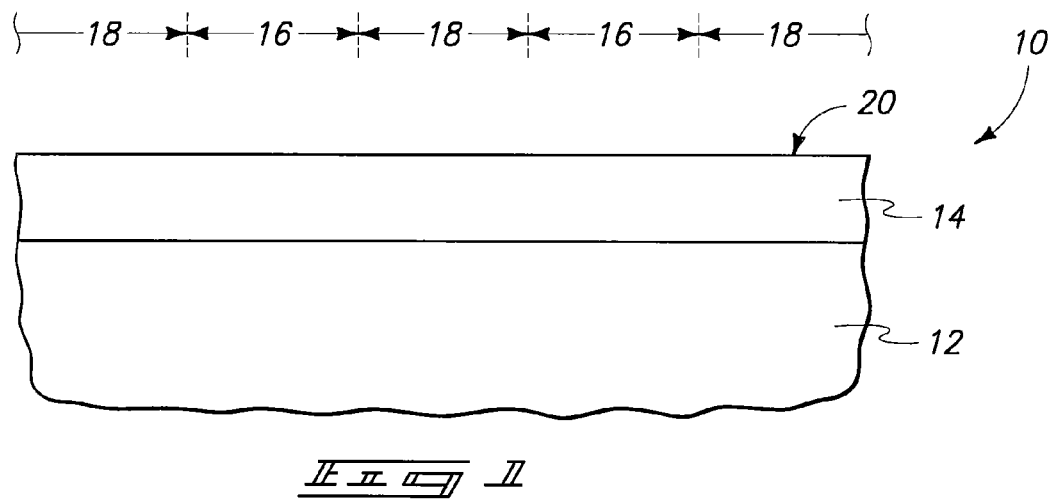
_Fig 1_
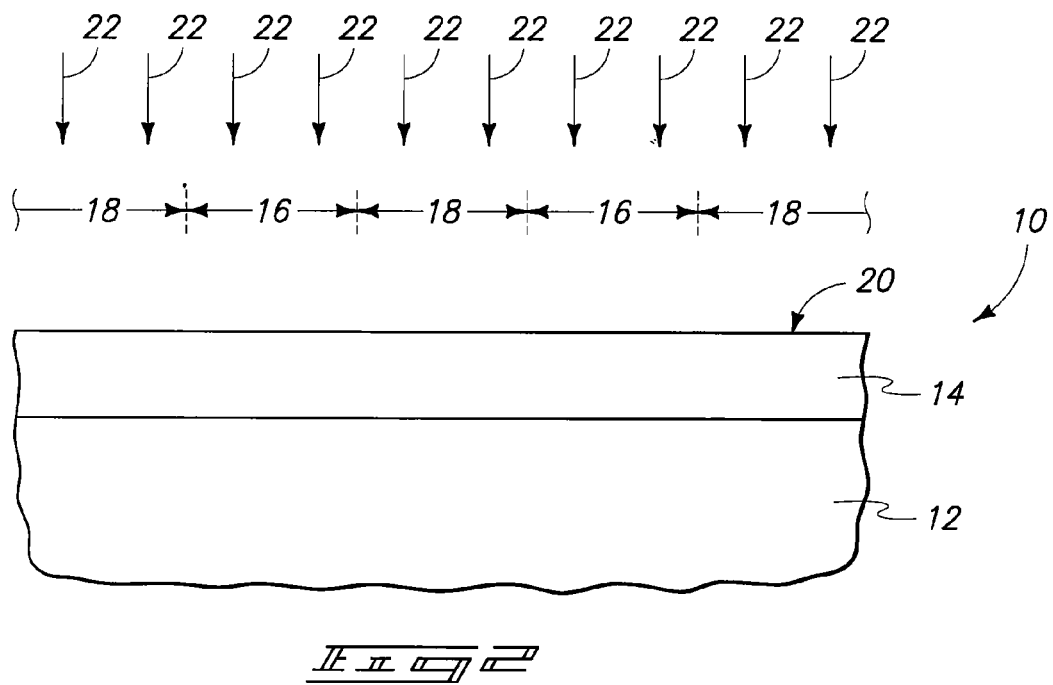
_Fig 2_

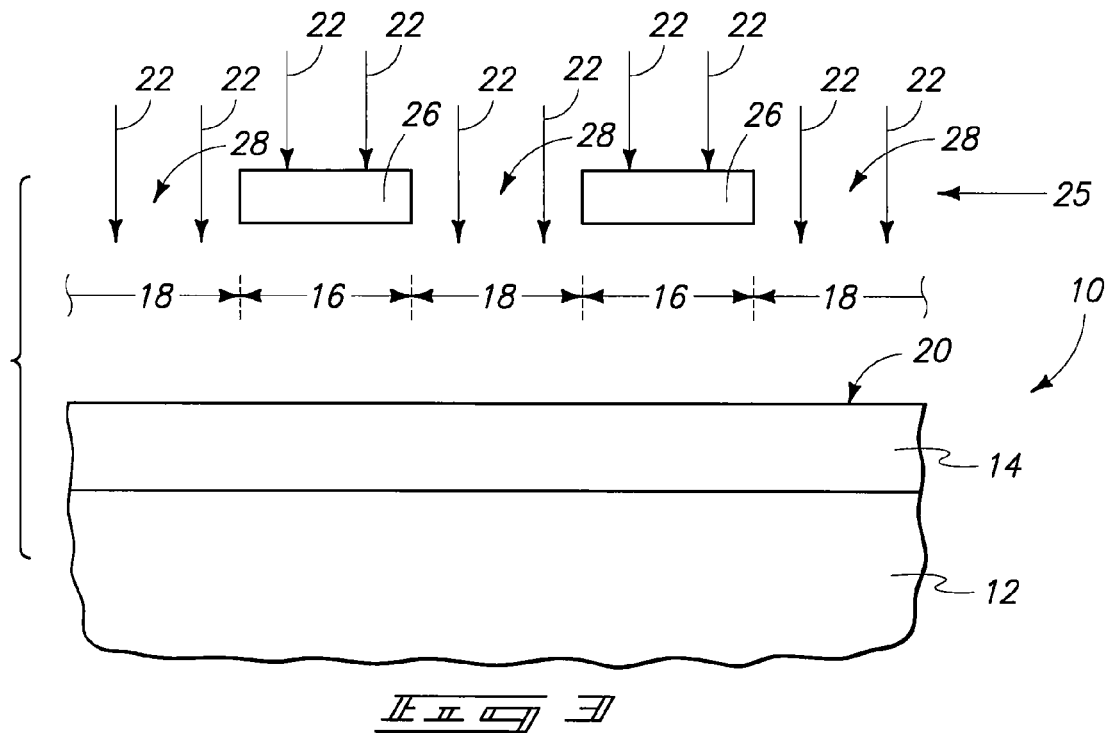
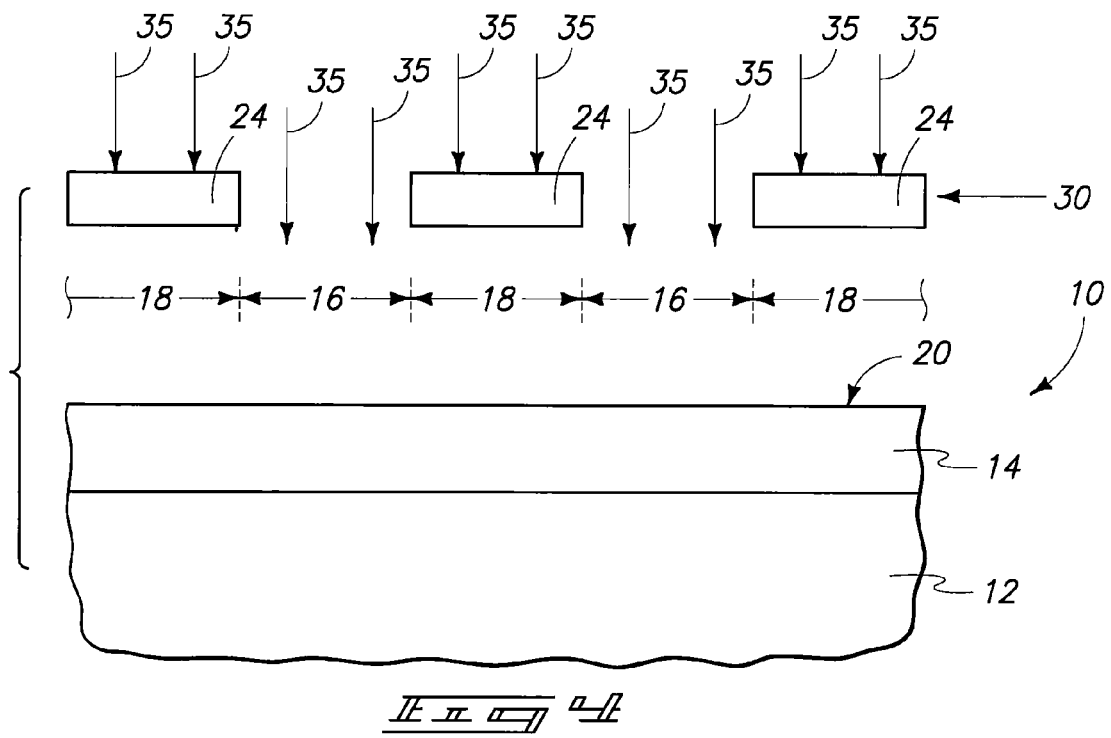

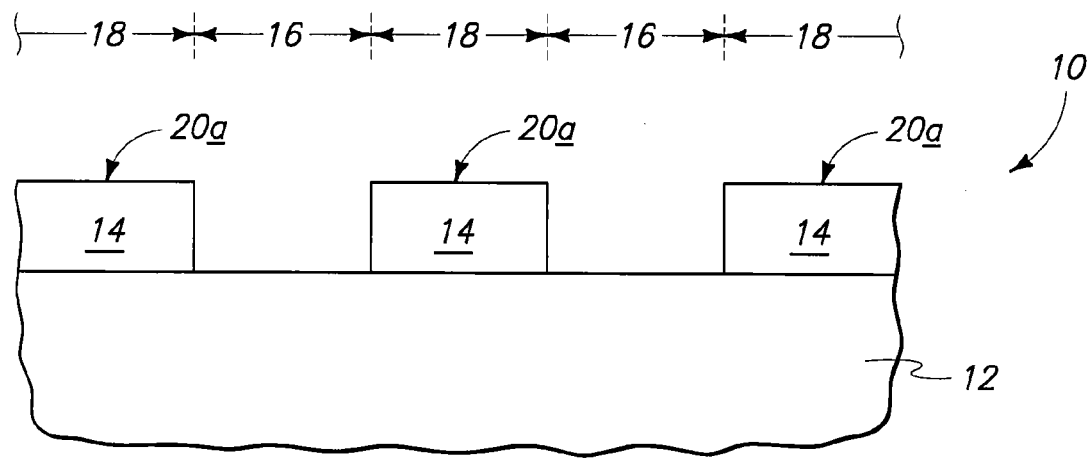

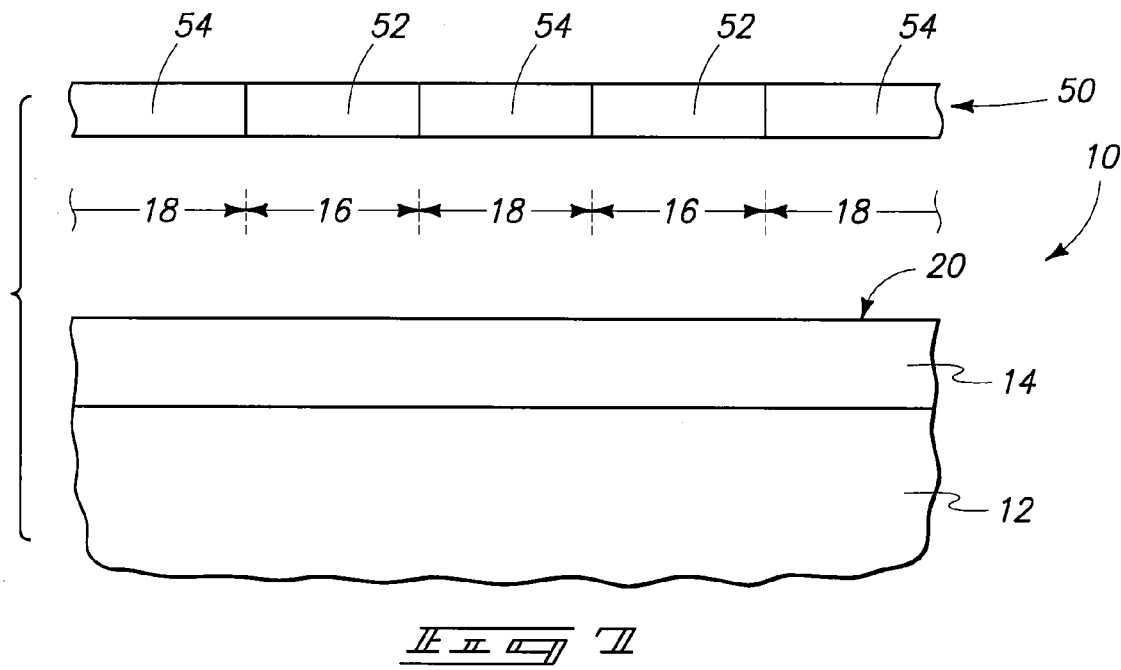
F I G 7
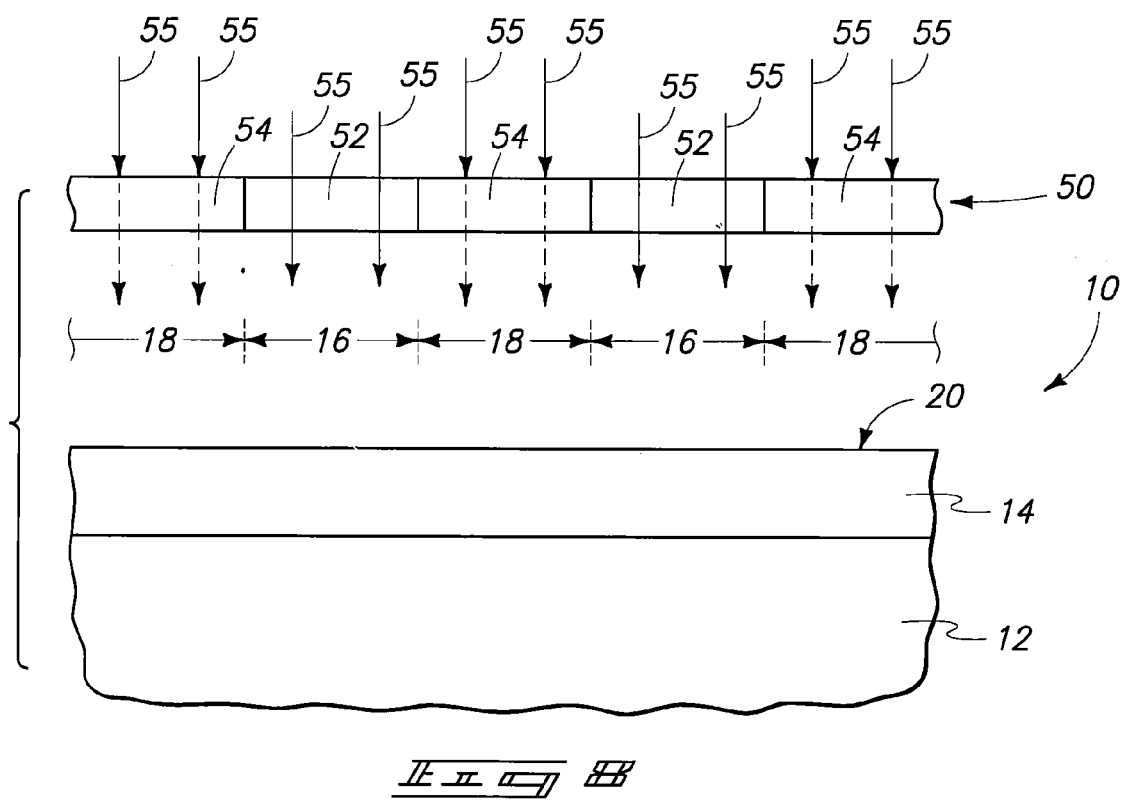
F I G 8

METHODS OF LITHOGRAPHICALLY PATTERNING A SUBSTRATE

TECHNICAL FIELD

Embodiments disclosed herein pertain to methods of lithographically patterning substrates.

BACKGROUND

A continuing goal in semiconductor processing is increased miniaturization while maintaining high performance. Modern semiconductor processes are still heavily reliant on lithography in fabricating integrated circuitry to achieve this goal.

Photolithography is a commonly-used method for patterning features during semiconductor processing. A radiation-sensitive material (i.e., photoresist) is formed over a substrate which is ultimately to be patterned, for example by etching or ion implanting. The photoresist is subsequently subjected to radiation which modifies the solubility of the exposed versus the non-exposed regions in a suitable developer solvent. Accordingly, the radiation is provided in a desired pattern so that some portions of the photoresist are exposed by the radiation while other portions of the photoresist are not exposed by the radiation. The photoresist is then subjected to developing conditions which selectively remove either the exposed or the non-exposed portions. Photoresists are designated to be either negative or positive. Exposed regions are selectively removed in a positive photoresist, while non-exposed regions are selectively removed in a negative photoresist.

The photoresist remaining after development defines a patterned mask on the substrate. The pattern of such mask can be subsequently transferred to the underlying material using appropriate etching and/or implanting techniques to form patterned features in material beneath the mask.

A problem which motivated embodiments of the invention disclosed herein pertains to water marks that remain on the positive photoresist surface after develop patterning. During develop or thereafter, the photoresist may be exposed to water, which can leave water marks on the outer surface of the photoresist. Such are commonly crystalline or other residual material which essentially deposits as a thin layer over the top of the photoresist in a blotchy manner. Some of these water marks actually extend over and into openings within the developed photoresist. Such can, of course, adversely affect subsequent processing of the substrate using the photoresist as a mask. Regardless, the patterned photoresist typically undergoes a post-development inspection or analysis prior to subsequent substrate processing using the mask to determine quality of the patterning of the photoresist mask. The water marks remaining over the substrate can adversely impact this inspection and analysis.

While embodiments of the invention were motivated in addressing the above-identified issues, it is no way so limited. Embodiments disclosed herein are only limited by the accompanying claims as literally worded, without interpretive or other limiting reference to the specification, and in accordance with the doctrine of equivalence.

BRIEF DESCRIPTION OF THE DRAWINGS

FIG. 1 is a diagrammatic sectional view of substrate in process in accordance with an aspect of the invention.

FIG. 2 is a view of the FIG. 1 substrate at a processing step subsequent to that shown by FIG. 1.

FIG. 3 is a view of the FIG. 1 substrate at a processing step subsequent to that shown by FIG. 1, and alternate or in addition to that shown by FIG. 2.

FIG. 4 is a view of the FIG. 2 substrate at a processing step subsequent to that shown by FIG. 2.

FIG. 5 is a view of the FIG. 4 substrate at a processing step subsequent to that shown by FIG. 4.

FIG. 7 is a diagrammatic sectional view of substrate in process in accordance with an aspect of the invention.

FIG. 8 is a view of the FIG. 7 substrate at a processing step subsequent to that shown by FIG. 7.

DETAILED DESCRIPTION OF EXAMPLE EMBODIMENTS

Figure 6:
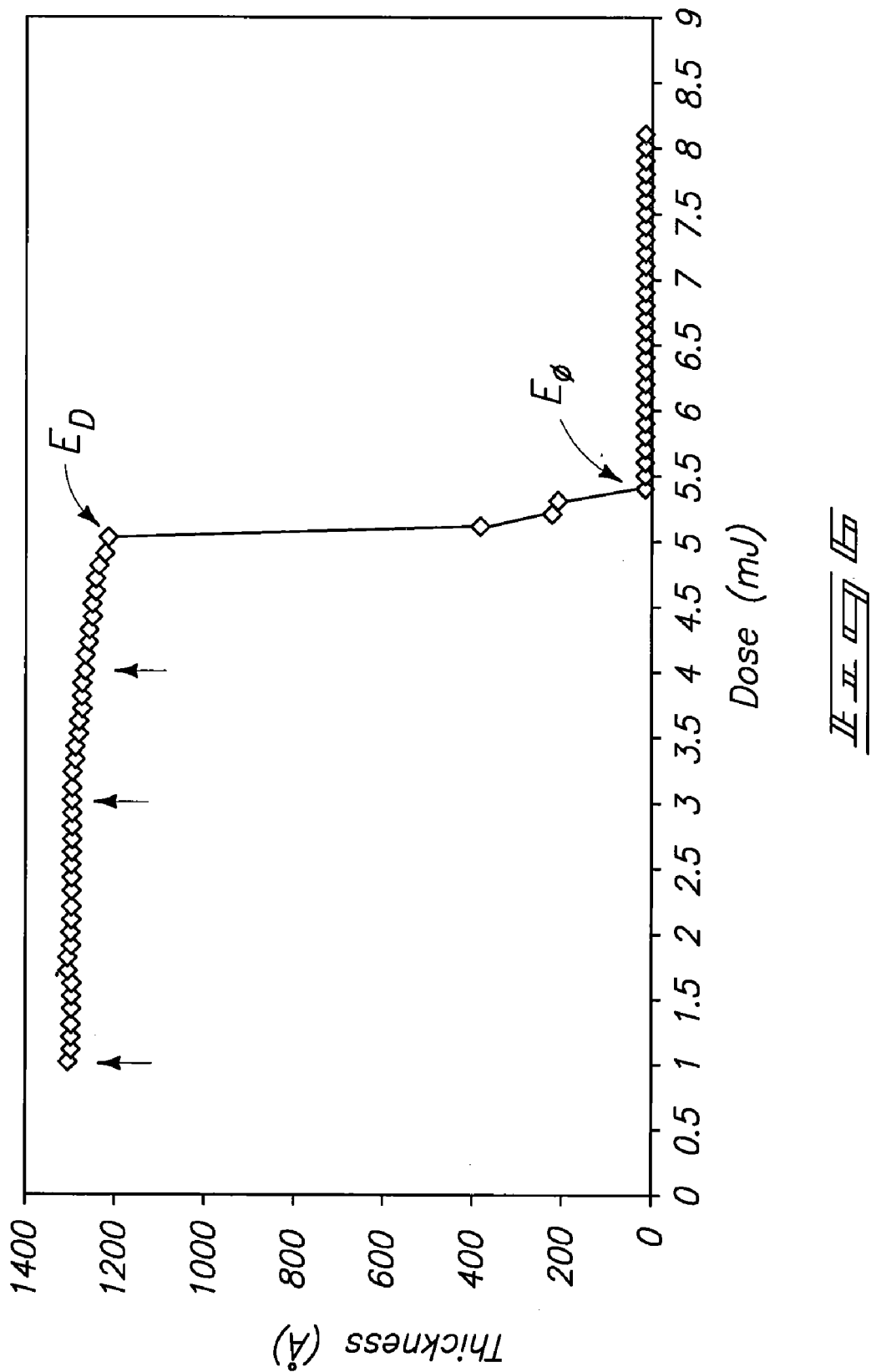
FIG. 6 is a plot of post-develop thickness of a photoresist as a function of incident radiation in millijoules of a reduction-to-practice example embodiment of the invention.

Example embodiments of methods of lithographically patterning a substrate are initially described with reference to FIGS. 1-5. Referring to FIG. 1, a substrate is indicated generally with reference 10. In one embodiment, substrate 10 may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 10 is depicted as comprising material or region 12 having a photoresist 14, for example a positive photoresist, formed thereover. Region 12 may be homogenous or non-homogenous, and may include numerous materials, devices, regions, and/or components fabricated therein. Regardless, photoresist 14 may be considered as comprising removal areas 16 and non-removal areas 18. Removal areas 16 are to be radiated effective to change photoresist solubility in a developer to be able to clear photoresist from such removal areas upon develop with the developer, and with non-removal areas 18 not to be so radiated, and as will be apparent from the continuing discussion.

Photoresist 14 can be considered as having an outer surface 20 which will be exposed to radiation. In some embodiments herein, such exposing may be referred to as a "first exposing" or as a "second exposing" for convenience and differentiation with respect to each as will be apparent from the continuing discussion. However, reference to "first" and "second" do not require temporal order between the two. In other words, the first exposing may occur prior to the second exposing, or the second exposing may occur prior to the first exposing. Further in some embodiments, the first exposing and the second exposing may occur concurrently. Also, additional exposure to radiation may occur before, after, or between the stated first exposing and second exposing.

Referring to FIG. 2, a first exposing to radiation has been conducted at least to non-removal areas 18 of photoresist 14. Such first exposing is indicated generally, by way of example only, by downwardly directed arrows 22. In one embodiment, the first exposing is effective to increase at least the post-develop outer surface roughness of the photoresist in the non-removal areas, but is ineffective to change photoresist solubility in a developer for the photoresist to be cleared from non-removal areas 18 upon develop with the developer. However, some photoresist may be removed in the non-removal areas during develop with the developer, and the first exposing may have some impact thereon. Regardless, the first exposing may or may not also be effective to increase pre-develop outer surface roughness of the photoresist as well as post-develop roughness.

The first exposing may or may not be through a mask. Regardless, exposure to radiation during the first exposing may or may not also be of removal areas 16, with exposure of removal areas being shown in FIG. 2. If removal areas 16 are exposed to the radiation during the first exposing, such is of course immaterial to post-develop roughness thereof as photoresist in removal areas 16 will ultimately be cleared from the substrate upon develop. Where the first exposing is also of removal areas 16, such might be blanket over the whole substrate (for example at the same time), or might not be blanket over the whole substrate, for example being in a stepped separate manner over different areas of the substrate. Regardless, where a mask is used, and regardless of whether the first exposing is also of the removal areas, the first exposing might or might not be through transparent openings in a mask.

FIG. 3 depicts an alternate embodiment first exposing to that of FIG. 2. In FIG. 3, a mask 25 is used. Such is depicted as comprising radiation blocking regions 26 and radiation transmissive regions 28 with respect to the selected wavelength and quanta/dose of incident radiation 22 which is used. Blocking regions 26 are shown to correspond (by way of example only) in size and dimension to removal areas 16, and mask openings 28 are shown to correspond in size and dimension to non-removal areas 18. Mask openings 28 are depicted as extending completely through mask 25, although such openings might comprise one or more materials the combination of which is effectively transmissive of incident radiation 22 for the first exposing.

Referring to FIG. 4, second exposing has been conducted of removal areas 16 to radiation (indicated by arrows 35) effective to change photoresist solubility in the developer for the photoresist to be cleared from removal areas 16 upon develop with the developer, as will be described below. By way of example only, FIG. 4 depicts the second exposing as having been conducted using a mask 30 having radiation opaque regions 24 effective to preclude transmission of incident radiation 35 to non-removal areas 18 so that such are not so effectively radiated during the second exposing.

The above-described FIGS. 1-4 embodiments depict an example wherein the first exposing occurs prior to the second exposing. However, the second exposing might occur prior to the first exposing. For example, the exposing of FIG. 4 could be conducted prior to either of the example FIG. 2 or 3 exposings. In one embodiment, the first exposing and the second exposing are with radiation of the same wavelength with respect to each. However, the first and second exposing may be with radiation of different wavelengths. Also, the first and second exposings might be conducted at the same time. Regardless and by way of example only, the first exposing might be conducted in a single exposure step or over multiple exposure steps. Further, the second exposing might be conducted in a single exposure step or over multiple exposure steps.

Referring to FIG. 5, and after the first exposing and after the second exposing, photoresist 14 is depicted as having been developed with the developer (for example by applying or otherwise exposing the developer to removal areas 16 and to non-removal areas 18) effective to clear photoresist 14 from removal areas 16, and to leave photoresist 14 in non-removal areas 18 that has outer surface 20a roughness in non-removal areas 18 which is greater than what it was before the first exposing. Of course, some thickness of the photoresist might also be removed from the non-removal areas and if so at least some photoresist will remain thereover. In one embodiment, the first exposing is effective to increase post-develop photoresist outer surface RMS (root mean squared) roughness in the non-removal areas which can be at least 25% greater than that before the first exposing, in one embodiment at least 50% greater, and in another embodiment at least 100% greater.

In one embodiment, at least non-removal areas 18 of photoresist 14 are exposed to liquid water at least one of during or after the developing, and the increase in roughness reduces the amount of photoresist outer surface water marks (i.e., either in one or both of number or size) in non-removal areas 18 than would otherwise occur under identical processing but for the first exposing. Such reduction in amount of water marks might be only partial, or might be essentially complete such that no water marks exist post-develop after any exposure of photoresist 14 to water either during or after developing. Without being limited by any theory of operation or theory of invention, it is believed that outer surface roughening as just-described is what facilitates reduction in post-develop water marks, although such might result from other phenomena whether alone or in combination with roughening. However and regardless, not all embodiments of the invention require roughening, nor do all embodiments of the invention require post-develop reduction in water marks, with the invention being limited by the accompanying claims as literally worded and in accordance with the doctrine of equivalence.

The invention was reduced-to-practice using SAIL X0181 photoresist available from ShinEtsu MicroSi of Phoenix, Ariz. Such was deposited to a deposition thickness of about 1,300 Angstroms, and incident radiation during the first and second exposings was deep ultraviolet radiation having a wavelength of 193 nanometers. Accordingly, in a reduction-to-practice example, the same radiation wavelength was used during both the first and second stated exposings. Alternate photoresists and alternate radiation including different wavelengths are of course also contemplated.

FIG. 6 depicts a graph of post-develop thickness in Angstroms as a function of incident radiation dose in millijoules (ml) for the above reduction-to-practice photoresist using 193 nanometer incident radiation. Such is depicted as having a dose-to-clear point $E_0$ of about 5.4 millijoules and a develop drop-off point $E_D$ of about 5 millijoules. In the context of this document, a "develop drop-off point" is that first dose of selected incident radiation for a photoresist wherein post-develop thickness experiences an initial thickness reduction of at least 150 Angstroms for the next 0.1 millijoule increase in radiation dose. In reduction-to-practice examples using the above example photoresist, incident dose of 3.0 millijoules did not result in either roughness increase nor post-develop reduction in the amount of photoresist outer surface water marks. However, incident radiation dose of 4.0 millijoules did result in both an increase in photoresist outer surface roughness in RMS and a decrease in photoresist outer surface water mark amount.

In a reduction-to-practice example, a first incident radiation dose of 4 millijoules resulted in a photoresist outer surface RMS roughness post-develop which was greater than that of the same photoresist prior to exposure to the 4 millijoule incident radiation dose. Of course, different photoresists and different incident wavelength radiation might result or experience different RMS values and/or different degree in amount of reduction of water marks in the photoresist outer surface post-develop. Further, use of different photoresists and/or different wavelength of incident radiation will likely produce different points $E_D$ and $E_0$, as well a different shape of the FIG. 6 plot. Regardless, in one embodiment in a method of lithographically patterning a substrate, the second exposing to the removal areas is at a value of $E_0$ or greater to effectively enable clearing of photoresist therefrom in forming a desired mask pattern on a substrate.

In one embodiment, a method of lithographically patterning a substrate comprises forming photoresist over a substrate, wherein the photoresist has a develop drop-off point (for example in millijoules) for a selected incident radiation wavelength. The photoresist comprises removal areas and non-removal areas, for example as described above in connection with FIG. 1.

First exposing is conducted of at least the non-removal areas to a dose of the selected radiation wavelength below and within 30% (for example, in units of millijoules) of the develop drop-off point. The dose during the first exposing is ineffective to change photoresist solubility in the developer for the photoresist to be cleared in the non-removal areas upon develop with the developer. By way of example only, FIGS. 2 and 3 depict such example processing. In one embodiment, the first exposing can be below and within 25% of the develop drop-off point, and in other example embodiments below and within 20%, below and within 15%, below and within 10%, and below and within 5% of the develop drop-off point.

Second exposing is conducted of the removal areas to a dose of the selected radiation wavelength which is at or above the develop drop-off point. The second exposing dose is effective to change photoresist solubility in the developer for the photoresist to be cleared in the removal areas upon develop with the developer. By way of example only, FIG. 4 depicts, and the above text pertaining thereto describes, such example processing. The first exposing might occur before or after the second exposing, or the first exposing and the second exposing might occur concurrently.

After the first exposing and the second exposing, the photoresist is developed with the developer effective to clear photoresist from the removal areas and to leave photoresist in the non-removal areas. Of course, some thickness of the photoresist might also be removed from the non-removal areas and if so at least some photoresist will remain thereover.

The first exposing may or may not be effective to increase photoresist outer surface roughness in the non-removal areas at least post-develop. Further and regardless, the first exposing may or may not be effective to reduce amount of photoresist outer surface water marks in the non-removal areas than would otherwise occur under identical processing but for the first exposing where at least the non-removal areas are exposed to liquid water at least one of during or after the developing.

Another embodiment, by way of example only, is shown and described in conjunction with FIGS. 7 and 8 with respect to an example first exposing and an example second exposing occurring concurrently. Referring initially to FIG. 7, a substrate 10 with photoresist 14 is depicted. A mask 50 has been provided over photoresist 14. Mask 50 has first radiation transmissive regions 52 which may define removal areas 16, and has second radiation transmissive regions 54 which may define non-removal areas 18. Transmissive regions 52 and 54 may of course define removal areas or non-removal areas independent of each other, and use of such transmissive regions for specific applications will be understood by one skilled in the art. One transmissive region may be more or less transmissive to a selected wavelength than another transmissive region. For example, second radiation transmissive regions 54 can be less transmissive of radiation of a selected wavelength than first radiation transmissive regions 52. For example, different materials and/or thicknesses of material might be utilized in different regions 52 and 54 to effectuate such transmissive differences.

Referring to FIG. 8, radiation of the selected wavelength contacts or impinges onto mask 50, as indicated generally by downwardly directed arrows 55. In one embodiment, mask 50 passes or allows impinging radiation 55 through second radiation transmissive regions 54 effective to increase photoresist outer surface roughness in non-removal areas 18 at least post-develop. However, the radiation allowed through is ineffective to change photoresist solubility in a developer for the photoresist to be cleared from non-removal areas 18 upon develop with the developer. In one example, the material in second radiation transmissive regions 54 is completely covering thereof (as shown) and of a thickness and material sufficient to allow passage of radiation there-through to impart such increase in surface roughness in non-removal areas 18. In another example, the material in second radiation transmissive regions 54 is largely radiation opaque and not completely covering thereof forming a spaced pattern of sub-resolution features (not shown) in regions 54 that is still sufficient to allow passage of radiation there-through, for example to impart such increase in surface roughness in non-removal areas 18. Mask 50 allows impinging radiation through first radiation transmissive regions 52 effective to change photoresist solubility in the developer for the photoresist to be cleared from removal areas 16 upon develop with the developer.

After the impinging, the photoresist is developed with the developer (for example by applying or otherwise exposing the developer to the removal areas and to non-removal areas 18) effective to clear photoresist from the removal areas and to leave photoresist in the non-removal areas that has outer surface roughness which is greater than that before the impinging, for example as described above and shown in connection with FIG. 5. Such passing or allowing of impinging radiation through second radiation transmissive regions 54 may or may not reduce amount of photoresist outer surface water marks in the non-removal areas then would otherwise occur under identical processing but for said passing of impinging radiation through second radiation transmissive regions 54. Any of the attributes and processing otherwise as described above may additionally be utilized and/or occur.

In one embodiment, impinging of radiation of the selected wavelength onto a mask 50 as shown in FIG. 8 passes or allows the impinging radiation through second radiation transmissive regions 54 below and within 30% of the develop drop-off point. Yet, such passing of radiation is ineffective to change photoresist solubility for the photoresist to be cleared from the non-removal areas upon develop with the developer. Such passing of impinging radiation through second radiation transmissive regions 54 may or may not be effective to increase photoresist outer surface roughness in the non-removal areas at least post-develop. Further and regardless, such passing of impinging radiation through second radiation transmissive regions 54 may or may not be effective in reducing amount of photoresist outer surface water marks in the non-removal areas where such are exposed to liquid water at least one of during or after the developing. Any of the processing and attributes as described above are also of course contemplated.

In one embodiment where water mark reduction occurs, such may be independent of roughening effect or other parameters regarding a first exposing and a second exposing.

For example, first exposing of radiation may be conducted at least to the non-removal areas to be ineffective to change photoresist solubility in a developer for the photoresist to be cleared from the non-removal areas upon develop with the developer. A second exposing of radiation may be conducted to the removal areas to be effective to change photoresist solubility in the developer for the photoresist to be cleared from the removal areas upon develop with the developer. After the first exposing and the second exposing, the photoresist is developed with the developer effective to clear photoresist from the removal areas and to leave photoresist in the non-removal areas. At least the non-removal areas of the photoresist are exposed to liquid water at least one of during or after the developing. The first exposing reduces the amount of outer surface water marks in the non-removal areas of the photoresist post-develop than would otherwise occur under identical processing but for the first exposing. Any or the processing and attributes as described above are also of course contemplated.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of lithographically patterning a substrate comprising photoresist which has removal areas and non-removal areas, the photoresist comprising an outer surface onto which incidence radiation passes into the photoresist, the method comprising:
   first exposing at least the non-removal areas to a single wavelength of radiation effective to increase outer surface roughness of a photoresist in the non-removal areas at least post-develop but ineffective to change a photoresist solubility in a developer for the photoresist to be cleared from the non-removal areas upon develop with the developer, the first exposing comprising impinging the single wavelength radiation onto the photoresist outer surface within the entirety of all of the non-removal areas;
   before or after the first exposing, second exposing only the removal areas to radiation effective to change the photoresist solubility in the developer for the photoresist to be cleared from the removal areas upon develop with the developer; and
   after the first exposing and the second exposing, developing the photoresist with the developer to clear the photoresist from the removal areas and to leave the photoresist in the non-removal areas that has outer surface roughness in the non-removal areas which is greater than that before the first exposing.

2. The method of claim 1 wherein the first exposing occurs prior to the second exposing.

3. The method of claim 1 wherein the second exposing occurs prior to the first exposing.

4. The method of claim 1 wherein the first exposing is ineffective to increase pre-develop photoresist outer surface roughness in the non-removal areas.

5. The method of claim 1 wherein the first exposing is effective to increase pre-develop photoresist outer surface roughness in the non-removal areas.

6. The method of claim 1 wherein the first exposing is also of the removal areas.

7. The method of claim 6 wherein the first exposing is not blanket over the whole substrate.

8. The method of claim 1 wherein the first exposing is through a mask.

9. The method of claim 8 wherein the first exposing is through transparent openings in the mask.

10. The method of claim 8 wherein the first exposing of the non-removal areas is not through openings in the mask.

11. The method of claim 1 wherein the first exposing is not through a mask.

12. The method of claim 1 wherein the first exposing and the second exposing are with radiation of the same wavelength.

13. The method of claim 1 comprising exposing at least the non-removal areas of the photoresist to liquid water at least one of during or after the developing, the increase in roughness reducing amount of outer surface water marks in the non-removal areas of the photoresist post-develop than would otherwise occur under identical processing but for the first exposing.

14. The method of claim 1 wherein the first exposing is effective to increase post-develop outer surface RMS roughness of the photoresist in the non-removal areas which is at least 25% greater than that before the first exposing.

15. The method of claim 1 wherein the first exposing is effective to increase post-develop outer surface RMS roughness of the photoresist in the non-removal areas which is at least 50% greater than that before the first exposing.

16. The method of claim 1 wherein the first exposing is effective to increase post-develop outer surface RMS roughness of the photoresist in the non-removal areas which is at least 100% greater than that before the first exposing.

17. A method of lithographically patterning a substrate comprising photoresist which has removal areas and non-removal areas, the photoresist comprising an outer surface onto which incidence radiation passes into the photoresist, the method comprising:
   first exposing the non-removal areas and the removal areas to a single wavelength of radiation effective to increase outer surface roughness of the a photoresist in the non-removal areas at least post-develop but ineffective to change a photoresist solubility in a developer for the photoresist to be cleared from the non-removal areas upon develop with the developer, the first exposing being blanket onto all of the photoresist outer surface over the whole substrate;
   before or after the first exposing, second exposing only the removal areas to an incident radiation effective to change the photoresist solubility in the developer for the photoresist to be cleared from the removal areas upon develop with the developer; and
   after the first exposing and the second exposing, developing the photoresist with the developer to clear the photoresist from the removal areas and to leave the photoresist in the non-removal areas that has outer surface roughness in the non-removal areas which is greater than that before the first exposing.

18. A method of lithographically patterning a substrate comprising photoresist which has removal areas and non-removal areas, the method comprising:
   first exposing the non-removal areas to a single wavelength of radiation effective to increase outer surface roughness of a photoresist in the non-removal areas at least post-develop but ineffective to change a photoresist solubility in a developer for the photoresist to be cleared from the non-removal areas upon develop with the developer, the first exposing not occurring in the removal areas;

before or after the first exposing, second exposing only the removal areas to incident radiation effective to change photoresist solubility in the developer for the photoresist to be cleared from the removal areas upon develop with the developer; and after the first exposing and the second exposing, developing the photoresist with the developer to clear the photoresist from the removal areas and to leave the photoresist in the non-removal areas that has outer surface roughness in the non-removal areas which is greater than that before the first exposing.

19. A method of lithographically patterning a substrate comprising photoresist which has removal areas and non-removal areas, the method comprising:

first exposing at least the non-removal areas to radiation at a single selected wavelength effective to increase outer surface RMS roughness of a photoresist in the non-removal areas at least post-develop by at least 25% but ineffective to change a photoresist solubility in a developer for the photoresist to be cleared from the non-removal areas upon develop with the developer;

before or after the first exposing, second exposing only the removal areas to radiation at the selected wavelength effective to change the photoresist solubility in the developer for the photoresist to be cleared from the removal areas upon develop with the developer; and after the first exposing and the second exposing, developing the photoresist with the developer to clear the photoresist from the removal areas and to leave the photoresist in the non-removal areas that has outer surface RMS roughness in the non-removal areas which is at least 25% greater than that before the first exposing.

20. The method of claim 19 wherein the first exposing is effective to increase post-develop outer surface RMS roughness of the photoresist in the non-removal areas which is at least 50% greater than that before the first exposing.

21. The method of claim 19 comprising exposing at least the non-removal areas to liquid water at least one of during or after the developing, the first exposing reducing amount of outer surface water marks in the non-removal areas of the photoresist post-develop than would otherwise occur under identical processing but for the first exposing.

22. A method of lithographically patterning a substrate comprising photoresist which has removal areas and non-removal areas, the method comprising:

first exposing at least the non-removal areas to a single wavelength of radiation ineffective to change a photoresist solubility in a developer for a photoresist to be cleared from the non-removal areas upon develop with the developer;

before or after the first exposing, second exposing only the removal areas to radiation effective to change the photoresist solubility in the developer for the photoresist to be cleared from the removal areas upon develop with the developer; and after the first exposing and the second exposing, developing the photoresist with the developer effective to clear photoresist from the removal areas and to leave photoresist in the non-removal areas; at least the non-removal areas of the photoresist being exposed to liquid water at least one of during or after the developing, the first exposing reducing amount of outer surface water marks in the non-removal areas of the photoresist post-develop than would otherwise occur under identical processing but for the first exposing.

23. A method of lithographically patterning a substrate comprising photoresist which has removal areas and non-removal areas, the method comprising:

first exposing at least the non-removal areas to a single wavelength of radiation effective to increase outer surface roughness of a photoresist in the non-removal areas at least post-develop but ineffective to change a photoresist solubility in a developer for the photoresist to be cleared from the non-removal areas upon develop with the developer;

before or after the first exposing, second exposing only the removal areas to incident radiation effective to change photoresist solubility in the developer for the photoresist to be cleared from the removal areas upon develop with the developer; and after the first exposing and the second exposing, developing the photoresist with the developer effective to clear the photoresist from the removal areas and to leave the photoresist in the non-removal areas that has outer surface roughness in the non-removal areas which is greater than that before the first exposing.

* * * * *

UNITED STATES PATENT AND TRADEMARK OFFICE
CERTIFICATE OF CORRECTION

PATENT NO.        : 8,309,297 B2
APPLICATION NO.   : 11/868328
DATED             : November 13, 2012
INVENTOR(S)       : Yoshiki Hishiro et al.

Page 1 of 1

It is certified that error appears in the above-identified patent and that said Letters Patent is hereby corrected as shown below:

On the Title page, in Item (56), under "Other Publications", in column 1, line 2, delete "Devectivity" and insert -- Defectivity --, therefor.

In column 8, line 40, in Claim 17, delete "the a" and insert -- a --, therefor.

Signed and Sealed this
Twenty-ninth Day of January, 2013

David J. Kappos
*Director of the United States Patent and Trademark Office*